US006955929B2

(12) United States Patent
Huang et al.

(10) Patent No.: US 6,955,929 B2
(45) Date of Patent: Oct. 18, 2005

(54) METHOD OF MEASURING A GATE CHANNEL LENGTH OF A METAL-OXIDE SEMICONDUCTOR TRANSISTOR

(75) Inventors: Cheng-Tung Huang, Kao-Hsiung (TW); Sheng-Hao Lin, Hsin-Chu Hsien (TW); Nien-Chung Li, Hsin-Chu (TW); Yi-Cheng Sheng, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/709,236

(22) Filed: Apr. 23, 2004

(65) Prior Publication Data

US 2004/0214356 A1      Oct. 28, 2004

(30) Foreign Application Priority Data

Apr. 25, 2003   (TW) ............................... 92109797 A

(51) Int. Cl.⁷ ............................................. H01L 21/66
(52) U.S. Cl. .......................................... 438/14; 438/17
(58) Field of Search ........................... 438/14, 17, 197, 438/199, 18; 257/48

(56) References Cited

U.S. PATENT DOCUMENTS

2002/0001899 A1 *  1/2002  Ito ............................. 438/231
2003/0224545 A1 * 12/2003  Chung et al. .................. 438/17

\* cited by examiner

Primary Examiner—Tuan H. Nguyen
(74) Attorney, Agent, or Firm—Winston Hsu

(57) ABSTRACT

A predetermined voltage is applied respectively on a first gate of a first metal-oxide semiconductor (MOS) transistor with a known channel length and a second gate of a second MOS transistor with an unknown channel length. A first inverse gate leakage current of the first MOS transistor and a second inverse gate leakage current of the second MOS transistor are then measured. By using the first and second inverse gate leakage currents, the channel widths of the first and the second gates, the channel length of the first gate and an equation, the channel length of the second gate is obtained.

19 Claims, 3 Drawing Sheets

METHOD OF MEASURING A GATE CHANNEL LENGTH OF A METAL-OXIDE SEMICONDUCTOR TRANSISTOR

BACKGROUND OF INVENTION

1. Field of the Invention

The present invention relates to a method of measuring a gate channel length of a metal-oxide semiconductor (MOS) transistor, and more specifically, to a method of obtaining the value of an unknown gate channel length of a MOS transistor by measuring an inverse gate leakage current of a sample MOS transistor with a known gate channel length and using a predetermined equation.

2. Description of the Prior Art

With the development of very large scale integration (VLSI), the low electricity consumption and high integration of metal-oxide-semiconductor (MOS) transistors allows them to be widely applied in the semiconductor process. Usually, a MOS transistor comprises a gate and two semiconductor regions, called a source and drain located on each side of a capacitor with an electrical characteristic opposite to that of the silicon substrate. The major structure of the gate is composed of a gate oxide layer and a gate conductive layer. When a proper bias is added to the gate, the MOS transistor can be regarded as a solid switch to control the connection of current.

In MOS transistor fabrication, a typical method to test a MOS transistor is frequently employed to continuously test the fabricated MOS transistors in every step so as to maintain the quality of every MOS transistor. Normally several test keys distributed in a periphery region of a die that is to be tested is provided, and a testing sample MOS transistor or a testing deposition layer is simultaneously fabricated in the test key area, typically formed on a scribe line between dies, with an actual MOS transistor so that the quality of the actual MOS transistor is judged by the performance of the testing sample MOS transistor. The quality, specification and functions of the actual MOS transistor therefore are well controlled, and the yield rate of MOS transistor manufacturing is consequently improved. As the semiconductor integration processes turn more and more complicated, it becomes one of the most important issues in the semiconductor industry to infer the characteristics of the MOS transistor correctly by measuring the value of an effective channel length of the MOS transistor precisely. Furthermore, the effective channel length of the MOS transistor is also one of the most important references for computer-aided designing (CAD).

According to the prior art, a scanning electron microscope (SEM) or a transmission electron microscopy (TEM) is frequently employed to measure the gate channel length of a MOS transistor. However, as semiconductor manufacturing technology progresses, process line width decreases to even less than 0.13 microns, so that errors often occur to the measuring results of the gate channel lengths of MOS transistors done by the SEM or TEM due to the scale limitations of the SEM and TEM. Consequently, the quality of the fabricated MOS transistors is seriously flawed, and the manufacturing yield rate is reduced as well. Therefore, it is indeed important to find out an alternative method to measure the gate channel length of a MOS transistor more precisely.

SUMMARY OF INVENTION

It is therefore a primary object of the present invention to provide an alternative method of measuring a gate channel length of a metal-oxide semiconductor transistor (MOS transistor) so as to avoid the imprecise measuring results done by a scanning electron microscope (SEM) or a transmission electron microscopy (TEM) in the prior art.

According to the claimed invention, a surface of a silicon substrate comprises a first region within either a scribe line area or a test key area, and a second region within an active area. A first MOS transistor, comprising a first gate, and a second MOS transistor, comprising a second gate, are respectively formed in the first and second regions. A predetermined voltage is then applied respectively on the first and second MOS transistors, and a first inverse gate leakage current of the first MOS transistor and a second inverse gate leakage current of the second MOS transistor are measured thereafter. Finally, a channel length of the second gate is obtained by substituting values for the first inverse gate leakage current, the second inverse gate leakage current, channel widths of the first and the second gates, a channel length of the first gate into an predetermined equation.

It is an advantage of the present invention against the prior art that a first gate oxide layer of the first MOS transistor and a second gate oxide layer of the second MOS transistor, both having a same composition and a same uniformity, have a same thickness of less than 20 angstroms, so that a direct tunneling current density of the first gate is equal to a direct tunneling current density of the second gate as the predetermined voltage is applied to the first and second MOS transistors. Therefore, the channel length of the second gate is precisely obtained by using the predetermined equation after the first and second inverse gate leakage currents are measured. Consequently, errors of testing results of the channel length of the second gate done by a SEM or a TEM are reduced, and yield rates of subsequent processes are therefore improved as well.

These and other objectives of the present invention will no doubt become obvious to those of ordinary skill in the art after reading the following detailed description of the preferred embodiment, which is illustrated in the multiple figures and drawings.

DETAILED DESCRIPTION

Figure 1:
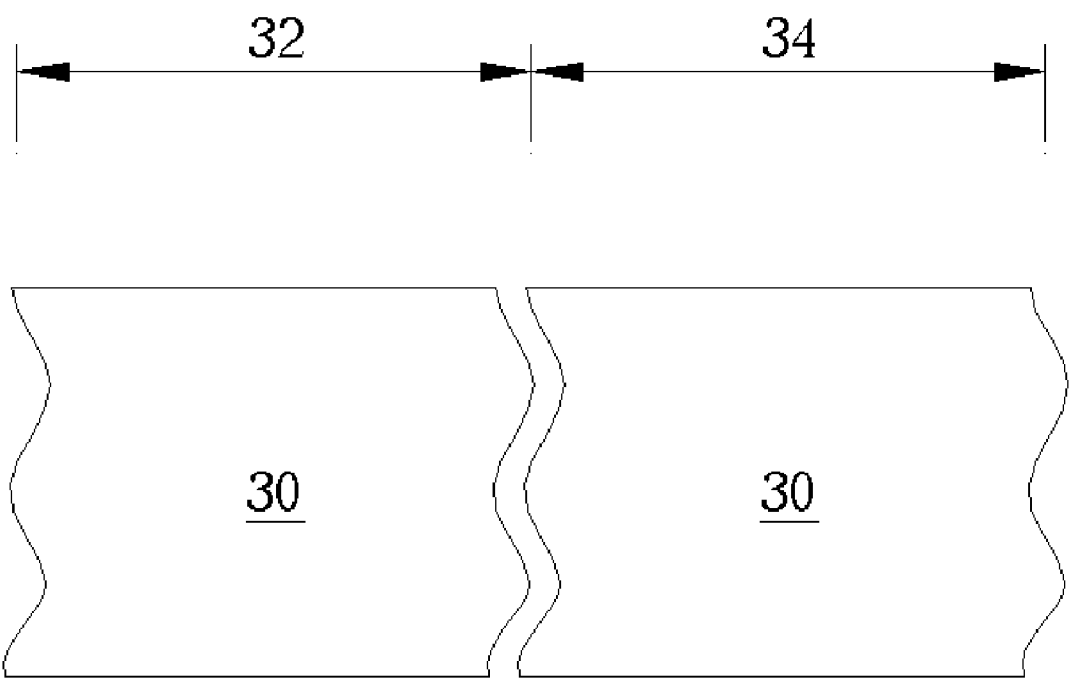
FIGS. 1 to 3 are cross-sectional views of method for measuring a gate channel length of a metal-oxide semiconductor (MOS) transistor according to the present invention.
Figure 2:
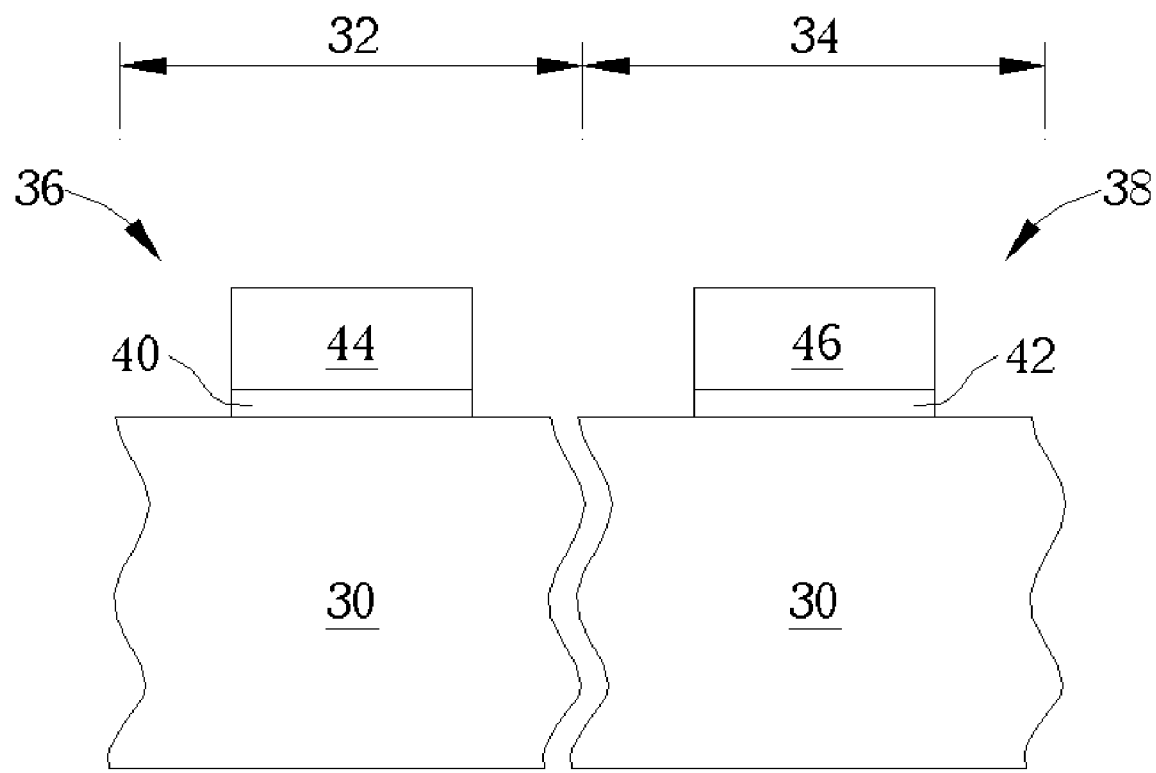
Figure 3:
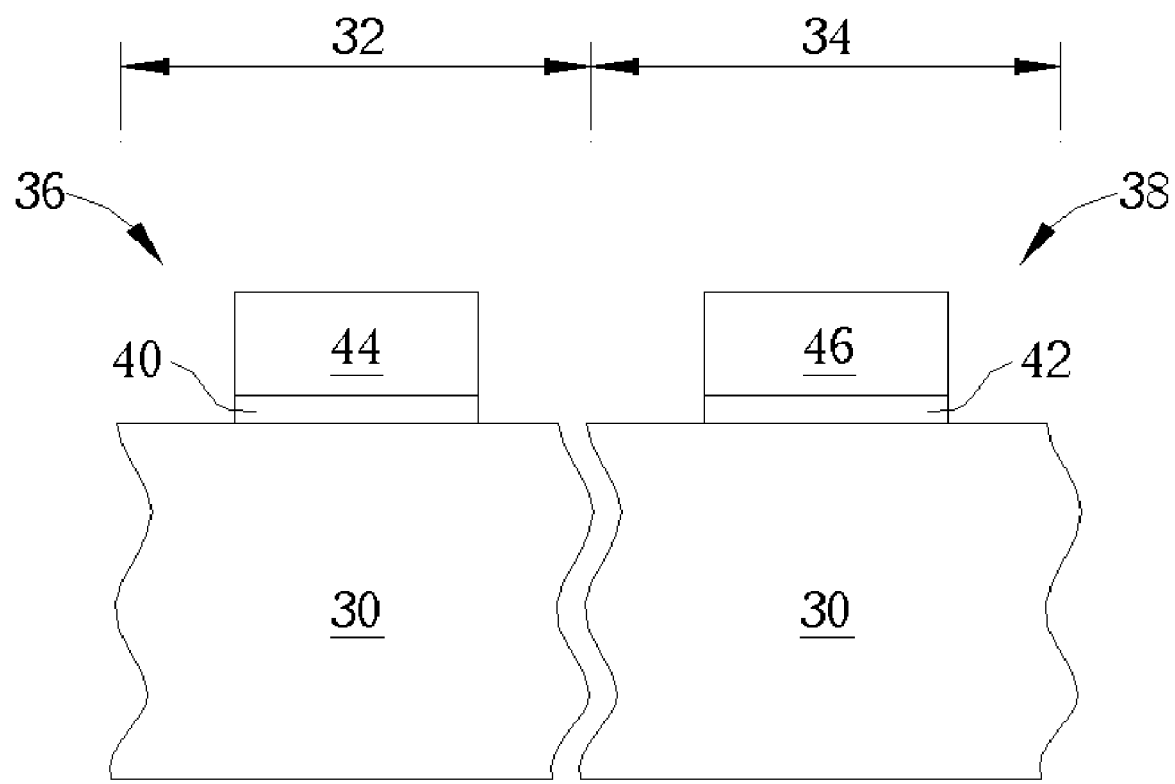

Please refer to FIGS. 1 to 3 of cross-sectional views of method for measuring a gate channel length of a metal-oxide semiconductor (MOS) transistor according to the present invention. As shown in FIG. 1, a surface of a silicon substrate 30 comprises a first region 32 and a second region 34. Wherein the first region 32 is within either a scribe line area or a test key area on the surface of the silicon substrate 30, and the second region 34 is within an active area on the silicon substrate 30.

As shown in FIG. 2, a first MOS transistor 36, comprising a first gate oxide layer 40 and a first gate 44 formed on the first gate oxide layer 40, and a second MOS transistor 38, comprising a second gate oxide layer 42 and a second gate 46 formed on the second gate oxide layer 40, are respectively formed within the first and second regions 32 and 34 simultaneously. Alternatively, the first and second MOS transistors 36 and 38 are orderly formed In the embodiment of the present invention, the first and second gate oxide layers 40 and 42 have same uniformity, composition and quality. In addition, both the first and second gate oxide layers 40 and 42 have a same thickness of less than 20 angstroms. For simplicity of description, a first source (not shown) and a first drain (not shown) formed on opposite sides of the first gate oxide layer 40, as well as a second source (not shown) and a second drain (not shown) formed on opposite sides of the second gate oxide layer 42, are neglected in FIG. 1 to FIG. 3 for those four items are not the primary subject in the present invention.

As shown in FIG. 3, a predetermined voltage V is then applied respectively on the first and second gates 44 and 46, and a first inverse gate leakage current of the first gate 44 and a second inverse gate leakage current of the second gate 46 are therefore generated. Wherein when the first and second MOS transistors 36 and 38 are both P-type MOS transistors, the predetermined voltage V is less than 2 volts: when the first and second MOS transistors 36 and 38 are both N-type MOS transistors, the predetermined voltage V is greater than 2 volts. The first and second inverse gate leakage currents are then measured.

As described in preceding paragraphs, the first and second gate oxide layers 40 and 42 have the same thickness of less than 20 angstroms. Therefore, a direct tunneling current density of the first gate 44 is equal to a direct tunneling current density of the second gate 46 as the predetermined voltage V is applied to the first and second gates 44 and 46. Since a direct tunneling current density is a ratio of an inverse gate leakage current to a surface area of a gate, an equation (1) is obtained as below:

$$Ig_1 \div (W_1 \times L_1) = Ig_2 \div (W_2 \times L_2) \quad (1)$$

wherein $Ig_1$ and $Ig_2$ respectively represent the first and second inverse gate leakage currents;

$W_1$ and $W_2$ respectively represent a gate channel length of the first gate 44 and a gate channel length of the second gate 46; and $L_1$ and $L_2$ respectively present a channel length of the first gate 44 and a channel length of the second gate 46.

According to the present semiconductor manufacturing processes, a gate channel width is much greater than a gate channel length, and is even much greater than the smallest division of the scale of a scanning electron microscope (SEM) or a transmission electron microscopy (TEM). In the preferred embodiment of the present invention, the channel length and width of the first gate 44 of the first MOS transistor 36, and the channel width of the second gate 46 of the second MOS transistor 38 are designed to be greater than the smallest division of the scale of a SEM or a TEM, and are therefore able to be measured. In addition, the first inverse gate leakage current of the first gate 44 and the second inverse gate leakage current of the second gate 46 can be measured easily. Consequently, a channel length of the second gate 46 is obtained by substituting values for the first inverse gate leakage current, the second inverse gate leakage current, channel widths of the first and the second gates 44 and 46, the channel length of the first gate 44 into the equation (1). As the process line width decreases to less than 0.13 microns, the method of measuring the channel length of the second gate 46 introduced in the present invention becomes more and more important and practical.

In comparison with the prior art, the first and second gate oxide layers 40 and 42 in the present invention have same uniformity, same composition and the thickness of less than 20 angstroms, so that the direct tunneling current density of the first gate 44 is equal to the direct tunneling current density of the second gate 46 as the predetermined voltage V is applied to the first and second gates 44 and 46. Therefore, the channel length of the second gate 46 is precisely obtained by using the predetermined equation (1) after the first and second inverse gate leakage currents of the first and second gates 44 and 46 are measured. By comparing the data obtained by the equation (1) and the testing results done by a TEM or a SEM, the channel length of the second gate 46 is much precisely obtained. Consequently, errors of testing results of the channel length of the second gate 46 done by a SEM or a TEM are reduced, and yield rates of subsequent processes are therefore improved as well.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A method of measuring a gate channel length of a metal-oxide semiconductor transistor (MOS transistor) on a silicon substrate comprising:
   forming a first MOS transistor, the first MOS transistor comprising a first gate with a known channel length and a known channel width, within a first region on a surface of the silicon substrate;
   forming a second MOS transistor, the second MOS transistor comprising a second gate with an unknown channel length and a known channel width, within a second region on the surface of the silicon substrate;
   applying a predetermined voltage on both the first gate and the second gate;
   measuring a first inverse gate leakage current of the first MOS transistor and a second inverse gate leakage current of the second MOS transistor; and
   using the first inverse gate leakage current, the second inverse gate leakage current, the channel widths of the first and the second gates, the channel length of the first gate and an equation to obtain the channel length of the second gate.

2. The method of claim 1 wherein the first and the second gate respectively comprise a first gate oxide layer and a second gate oxide layer, the first gate oxide layer having a thickness equal to a thickness of the second gate oxide layer.

3. The method of claim 2 wherein the thicknesses of the first and the second gate oxide layers are both less than 20 angstroms.

4. The method of claim 1 wherein the first and second MOS transistors are both P-type MOS transistors.

5. The method of claim 4 wherein the predetermined voltage is less than 2 volts.

6. The method of claim 1 wherein the first and second MOS transistors are both N-type MOS transistors.

7. The method of claim 6 wherein the predetermined voltage is greater than 2 volts.

8. The method of claim 1 wherein the equation is expressed as follows:

$$Ig_1 \div (W_1 \times L_1) = Ig_2 \div (W_2 \times L_2)$$

wherein $Ig_1$ and $Ig_2$ respectively represent the first and second inverse gate leakage currents, $W_1$ and $W_2$ respectively represent the channel widths of the first and second gates, and $L_1$ and $L_2$ respectively represent the channel lengths of the first and the second gates.

9. The method of claim 1 wherein the first region is within a scribe line area on the surface of the silicon substrate, and the second region is within an active area on the surface of the silicon substrate.

10. The method of claim 1 wherein the first region is within a test key area on the surface of the silicon substrate.

11. A method of measuring a gate channel length of a MOS transistor on a silicon substrate comprising:
   forming a first MOS transistor, the first MOS transistor comprising a first gate with a known channel length and a known channel width, and a second MOS transistor, the second MOS transistor comprising a second gate with an unknown channel length and a known channel width, respectively within a first region and a second region on a surface of the silicon substrate;
   applying a predetermined voltage on both the first gate and the second gate; and
   measuring a first inverse gate leakage current of the first MOS transistor and a second inverse gate leakage current of the second MOS transistor;
   wherein the channel length of the second gate is equal to $(Ig_2 \times W_1 \times L_1) \div (Ig_1 \times W_2)$, wherein $Ig_1$ and $Ig_2$ respectively represent the first and second inverse gate leakage currents, $W_1$ and $W_2$ respectively represent the channel widths of the first and second gates, and $L_1$ represents the channel length of the first gate.

12. The method of claim 11 wherein the first and the second gates respectively comprise a first gate oxide layer and a second gate oxide layer, the first gate oxide layer having a thickness equal to a thickness of the second gate oxide layer.

13. The method of claim 12 wherein the thicknesses of the first and the second gate oxide layers are both less than 20 angstroms.

14. The method of claim 11 wherein the first and second gates are gates of two different P-type MOS transistors.

15. The method of claim 14 wherein the predetermined voltage is less than 2 volts.

16. The method of claim 11 wherein the first and second gates are gates of two different N-type MOS transistors.

17. The method of claim 16 wherein the predetermined voltage is greater than 2 volts.

18. The method of claim 11 wherein the first region is within a scribe line area on the surface of the silicon substrate, and the second region is within an active area on the surface of the silicon substrate.

19. The method of claim 11 wherein the first region is within a test key area on the surface of the silicon substrate.

* * * * *

UNITED STATES PATENT AND TRADEMARK OFFICE
CERTIFICATE OF CORRECTION

PATENT NO. : 6,955,929 B2  Page 1 of 1
APPLICATION NO. : 10/709236
DATED : October 18, 2005
INVENTOR(S) : Huang et al.

It is certified that error appears in the above-identified patent and that said Letters Patent is hereby corrected as shown below:

On the Title page item (75), should read as follows:

Cheng-Tung Huang, Kao-Hsiung (TW);
Sheng-Hao Lin, Hsin-Chu Hsien (TW);
<u>Chien-Chieh Huang, Taipei City (TW);</u>
Nien-Chung Li, Hsin-Chu (TW);
Yi-Cheng Sheng, Hsin-Chu (TW)

Signed and Sealed this

Twenty-fifth Day of November, 2008

JON W. DUDAS
*Director of the United States Patent and Trademark Office*